(12) United States Patent  
Moriwaki

(10) Patent No.: US 9,024,524 B2  
(45) Date of Patent: May 5, 2015

(54) DISPLAY, METHOD FOR PRODUCING DISPLAY, AND ELECTRONIC APPARATUS

(71) Applicant: Sony Corporation, Tokyo (JP)

(72) Inventor: Toshiki Moriwaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/860,066

(22) Filed: Apr. 10, 2013

(65) Prior Publication Data  
US 2013/0221841 A1 Aug. 29, 2013

Related U.S. Application Data

(63) Continuation of application No. 12/773,261, filed on May 4, 2010, now Pat. No. 8,482,196.

(30) Foreign Application Priority Data

May 26, 2009 (JP) ................................. 2009-125944

(51) Int. Cl.  
H01L 51/50 (2006.01)  
H05B 33/04 (2006.01)  
H01L 51/52 (2006.01)  
H05B 33/10 (2006.01)  
H01L 27/32 (2006.01)

(52) U.S. Cl.  
CPC .............. *H05B 33/04* (2013.01); *H01L 27/322* (2013.01); *H01L 51/5237* (2013.01); *H05B 33/10* (2013.01)

(58) Field of Classification Search  
USPC ................ 427/66, 532–535, 539; 257/40, 72, 257/98–100, 642–643, 759; 313/498–512; 428/690–691, 917; 438/26–29, 34, 82  
See application file for complete search history.

(56) References Cited

U.S. PATENT DOCUMENTS

| 4,213,074 | A | * | 7/1980 | Kawaguchi et al. | ......... 313/509 |
| 4,967,117 | A | | 10/1990 | Yoshioka et al. | |
| 5,757,126 | A | | 5/1998 | Harvey et al. | |
| 5,811,177 | A | * | 9/1998 | Shi et al. | ....... 428/209 |
| 6,717,052 | B2 | | 4/2004 | Wang et al. | |
| 6,872,473 | B2 | * | 3/2005 | Song et al. | ...... 428/690 |
| 7,279,239 | B2 | | 10/2007 | Akedo et al. | |
| 8,253,328 | B2 | * | 8/2012 | Hayashi | ...... 313/512 |

(Continued)

FOREIGN PATENT DOCUMENTS

| JP | 2003-203763 | 7/2003 |
| JP | 2003-297554 | 10/2003 |

(Continued)

*Primary Examiner* — Anh Mai  
*Assistant Examiner* — Fatima Farokhrooz  
(74) *Attorney, Agent, or Firm* — Dentons US LLP

(57) ABSTRACT

A display includes a first substrate including elements arranged on a main surface of the first substrate, a second substrate arranged so as to face the main surface of the first substrate on which the elements are arranged, a first sealing layer arranged between the first substrate and the second substrate, and a second sealing layer arranged between the first substrate and the second substrate so as to surround the first sealing layer. The second substrate has a peripheral projection, the entirety of which projects toward the side on which the elements are arranged, and the peripheral projection surrounds the first sealing layer. The second sealing layer is arranged between the first substrate and the second substrate so as to extend from the periphery of the first sealing layer to the peripheral projection.

10 Claims, 7 Drawing Sheets

(56) References Cited

U.S. PATENT DOCUMENTS

| | | | |
|---|---|---|---|
| 2004/0061437 A1* | 4/2004 | Ikagawa | 313/506 |
| 2006/0020613 A1 | 1/2006 | Harvey | |
| 2006/0158111 A1* | 7/2006 | Hayashi | 313/512 |
| 2008/0012124 A1* | 1/2008 | Stapleton et al. | 257/713 |
| 2009/0093105 A1* | 4/2009 | Kobayashi et al. | 438/478 |
| 2010/0264817 A1 | 10/2010 | Bouten et al. | |
| 2011/0068327 A1* | 3/2011 | Morishima | 257/40 |

FOREIGN PATENT DOCUMENTS

| | | |
|---|---|---|
| JP | 3501148 | 12/2003 |
| JP | 2005-339863 | 12/2005 |
| JP | 2008-059868 | 3/2008 |
| JP | 2008-210788 | 9/2008 |

* cited by examiner

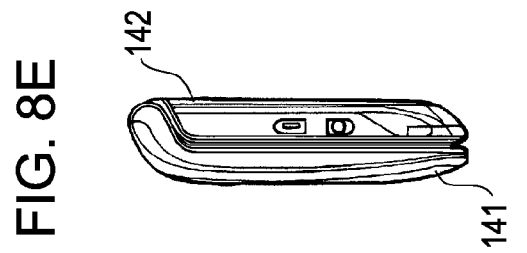
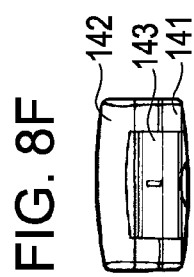
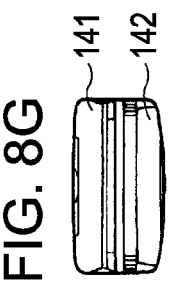
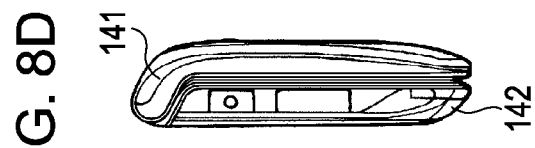
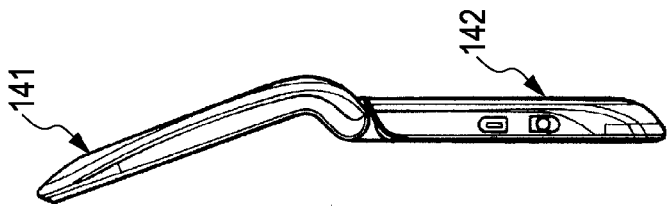
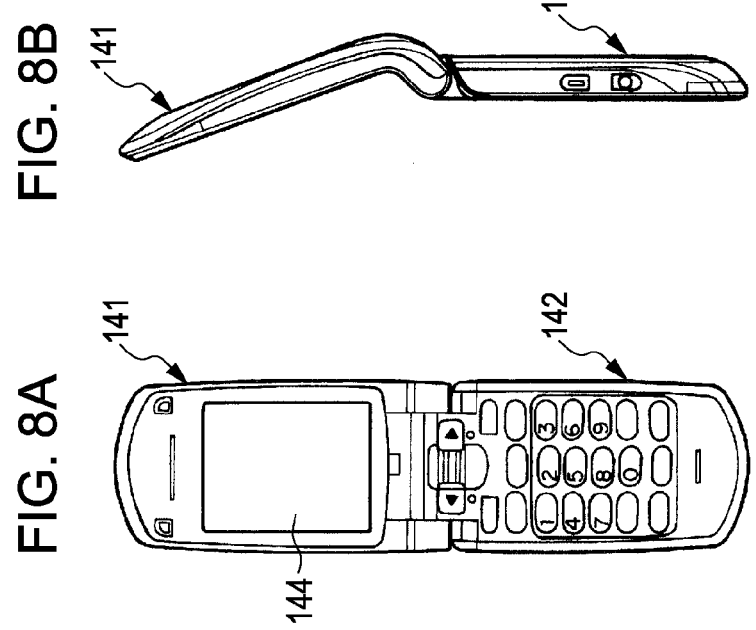

DISPLAY, METHOD FOR PRODUCING DISPLAY, AND ELECTRONIC APPARATUS

RELATED APPLICATION DATA

This application is a continuation of U.S. patent application Ser. No. 12/773,261 filed May 4, 2010, the entirety of which is incorporated herein by reference to the extent permitted by law. The present application claims the benefit of priority to Japanese Patent Application No. JP 2009-125944 filed on May 26, 2009 in the Japan Patent Office, the entirety of which is incorporated by reference herein to the extent permitted by law.

BACKGROUND OF THE INVENTION

1. Field of the Invention

The present invention relates to a display, a method for producing a display, and an electronic apparatus, and more specifically, to a display including a light-emitting element sealed between two substrates, a method for producing the display, and an electronic apparatus including the display.

2. Description of the Related Art

In displays including arrayed organic electroluminescent elements, the organic electroluminescent elements are extremely sensitive to water and oxygen and degraded by gases (e.g., water vapor and oxygen) that permeating from the outside, easily causing defects such as nonluminous areas (dark spots) and a reduction in luminance. Accordingly, it is important to employ a sealing technique to prevent the permeation of gases.

Currently, a sealing structure is used in which light-emitting elements arranged on a first substrate are covered with a protective film, and a second substrate is arranged so as to face the protective film, so that the light-emitting elements are sealed between the first substrate and the second substrate. Japanese Patent No. 3501148 (see FIG. 1 and paragraph No. [0009]) discloses a first exemplary sealing structure in which an adhesive layer is arranged between a first substrate and a second substrate so as to cover the entire surface including a display region where light-emitting elements are arranged. Japanese Unexamined Patent Application Publication No. 2003-203763 (see FIGS. 4A to 5C, and paragraph No. [0012]) discloses a second exemplary sealing structure in which perimeters of a first substrate and a second substrate are sealed with a sealing layer to hold a display region including light-emitting elements in a hermetically sealed cavity or in which a display region is sealed with another sealing layer.

SUMMARY OF THE INVENTION

In the first exemplary sealing structure, however, the adhesive layer that reaches the display region is exposed at the entire perimeters of the first and second substrates and over the entire surface in the height direction. Thus, a gas outside the display is liable to enter the display region through the adhesive layer. It is therefore difficult to provide a sufficient sealing effect. In the second exemplary sealing structure, the sealing layer is also exposed over the entire perimeters of the first and second substrates and over the entire surface in the height direction. Thus, a gas outside the display is liable to enter the display region in the hermetically sealed cavity and a display region covered with another sealing layer through the sealing layer. It is therefore difficult to provide a sufficient sealing effect.

It is desirable to provide a display which is capable of sufficiently preventing the permeation of a gas outside the display into a display region including elements and performing display with high reliability, and a method for producing the display.

According to an embodiment of the present invention, there is provided a display including a first substrate including elements arranged on a main surface of the first substrate, a second substrate arranged so as to face the main surface of the first substrate on which the elements are arranged, a first sealing layer, and a second sealing layer, the first and second sealing layers being arranged between the first substrate and the second substrate, the first sealing layer being arranged so as to cover the elements, and the second sealing layer being arranged so as to surround the first sealing layer. In this structure, in particular, the second substrate has a peripheral projection, the entirety of which projects toward the side on which the elements are arranged, and the peripheral projection surrounds the first sealing layer. Furthermore, the second sealing layer is arranged between the first substrate and the second substrate so as to extend from the periphery of the first sealing layer to the peripheral projection.

According to an embodiment of the present invention, there is provided an electronic apparatus.

In the display having the structure described above, the distance of the gap between the first substrate and the peripheral projection of the second substrate over the entire perimeter is smaller than the distance between the first substrate and the second substrate in the display region. Furthermore, the second sealing layer is arranged in the narrow gap over the entire perimeter. Thus, a portion where the second sealing layer is exposed to the outside is minimized, preventing the permeation of external gases (water vapor and oxygen) into the first sealing layer through the second sealing layer.

According to an embodiment of the present invention, there is provided a method for producing a display including the following steps. In a first step, a first sealing layer is formed on a first substrate to cover elements arranged on the first substrate. In a second step, an uncured material for a second sealing layer is fed onto the first substrate to surround the first sealing layer. In a third step, a second substrate with a peripheral projection in one direction is arranged, the entirety of the peripheral projection projects in such a manner that the second substrate faces the first substrate and the first sealing layer is surrounded by the peripheral projection, so that the first sealing layer is arranged between the first substrate and the second substrate. In a fourth step, the material for the second sealing layer that has been fed around the first sealing layer is filled into the whole region between the peripheral projection and the first substrate by capillary action. In a fifth step, the material for the second sealing layer between the first substrate and the second substrate is cured to form the second sealing layer.

In the production method described above, the material for the second sealing layer that has been fed around the first sealing layer is filled into the whole region between the peripheral projection and the first substrate by capillary action. Thereby, the display having the foregoing structure is produced while the second sealing layer does not protrude from the gap between the first substrate and the second substrate, so that the area of the second sealing layer exposed to the outside is minimized.

As described above, according to an embodiment of the present invention, a portion where the second sealing layer arranged around the first sealing layer is exposed to the outside is minimized, thereby preventing the permeation of external gases (water vapor and oxygen) into the first sealing layer through the second sealing layer and the deterioration of the elements covered with the first sealing layer. It is thus possible to improve the reliability of a display and an electronic apparatus each of which includes panels in which elements are sealed between a first substrate and a second substrate.

BRIEF DESCRIPTION OF THE DRAWINGS

FIG. 5A is a perspective view illustrating of the digital camera when viewed from the front side thereof, and FIG. 5B is a perspective view of the digital camera when viewed from the rear side thereof;

FIGS. 8A to 8G are show a portable terminal device, such as a cellular phone, including a display according to an embodiment of the present invention, FIG. 8A is a front view of the device in an open state, FIG. 8B is a side view thereof, FIG. 8C is a front view of the device in a closed state, FIG. 8D is a left-side view thereof, FIG. 8E is a right-side view thereof, FIG. 8F is a top view thereof, and FIG. 8G is a bottom view thereof.

DESCRIPTION OF THE PREFERRED EMBODIMENTS

Figure 1:
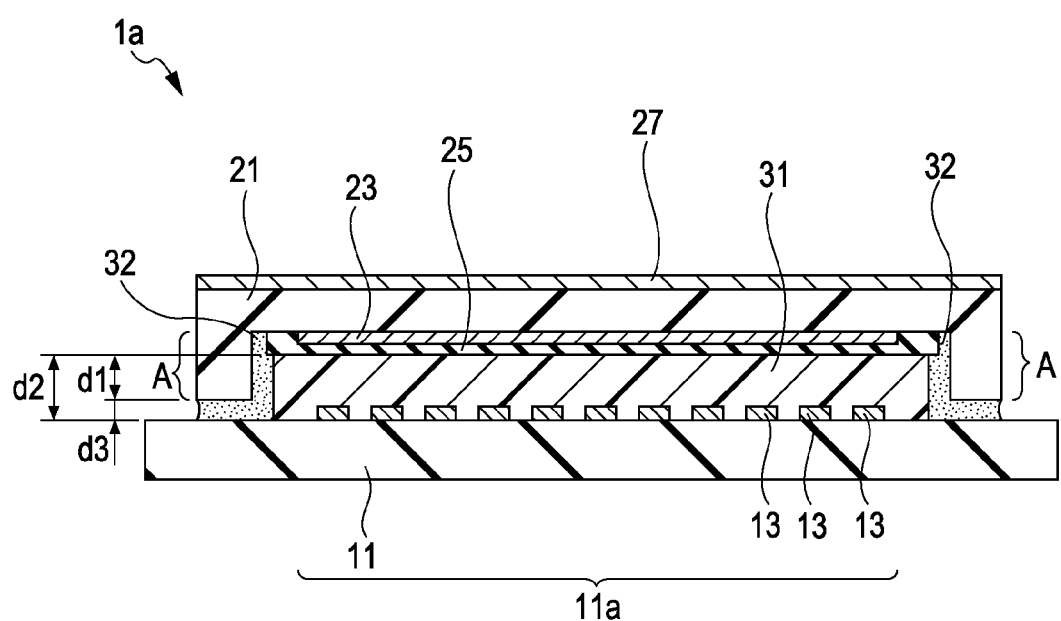
FIG. 1 is a schematic cross-sectional view of a display according to a first embodiment.

Embodiments of the present invention will be described below with reference to the attached drawings in the following order:
1. a first embodiment (an exemplary display including a second substrate with an integrally formed projection);
2. a second embodiment (an exemplary display including a second substrate with a separately formed projection); and
3. a third embodiment (examples of electronic apparatuses including display panels).
1. First Embodiment
Structure of Display FIG. 1 is a schematic cross-sectional view illustrating the structure of a display 1a according to a first embodiment. An example of the display 1a shown in this figure is a display including organic electroluminescent elements and has the structure described below.

A plurality of light-emitting elements are arrayed in a wide display region 11a arranged in the middle of a first substrate 11. A second substrate 21 is arranged so as to face a side of the first substrate 11 on which light-emitting elements 13 are arranged. A first sealing layer 31 is formed between the first substrate 11 and the second substrate 21 so as to cover the display region 11a including the light-emitting elements 13. Furthermore, a second sealing layer 32 is formed so as to surround the first sealing layer 31. In particular, in the first embodiment, the entire periphery of the second substrate 21 is provided with a peripheral projection A extending toward the side on which the elements are arranged. The display is formed by arranging the second sealing layer 32. Each component will be described in detail below.

A material constituting the first substrate 11 is not particularly limited so long as the insulation of the surface of the first substrate 11 on which the light-emitting elements 13 are arranged is maintained. A plastic substrate, a glass substrate, or a substrate in which an insulating film is arranged on a metal foil substrate is used. In the case where the display 1a has to be flexible, a plastic substrate or a metal foil substrate covered with an insulating film is preferably used. In the case of using the plastic substrate, at least one surface of the plastic substrate is preferably covered with a protective film composed of an inorganic material (inorganic protective film). In the case of using the metal foil substrate, the insulating film covering the metal foil substrate is preferably composed of an inorganic material. The arrangement of the inorganic protective film prevents the permeation of gases (water vapor and oxygen) into the region between the first substrate 11 and the second substrate 21.

The light-emitting elements 13 are, for example, self-luminous elements such as organic electroluminescent elements. The light-emitting elements 13 are connected to driving circuits including thin-film transistors (not shown). The entire surface of the first substrate 11 on which the light-emitting elements 13 are arranged is preferably covered with a protective film (passivation film), not shown, composed of an inorganic material.

The second substrate 21 is, for example, a substrate from which display light emerges. A material constituting the second substrate 21 is not particularly limited so long as the material is optically transparent. A plastic substrate, a glass substrate, or an insulative substrate in which an insulating film is arranged on a metal foil substrate is used. In the case where the display 1a has to be flexible as well as the first substrate 11, a plastic substrate or a film substrate such as a metal foil substrate covered with an insulating film is preferably used. In the case of using the plastic substrate, at least one surface of the plastic substrate is preferably covered with a protective film composed of an inorganic material (inorganic protective film). In the case of using the metal foil substrate, the insulating film covering the metal foil substrate is preferably composed of an inorganic material. The arrangement of the inorganic protective film prevents the permeation of gases (water vapor and oxygen) into the region between the first substrate 11 and the second substrate 21.

As described above, the second substrate 21 has a cap structure in which the entire periphery of the second substrate 21 facing the first substrate 11 includes the integrally formed peripheral projection A. The peripheral projection A is arranged so as to surround the first sealing layer 31 on the display region 11a. The use of the integrally formed peripheral projection A of the second substrate 21 reduces interfaces exposed to the outside, thereby preventing the permeation of gases (water vapor and oxygen) through the interfaces.

A color filter layer 23 corresponding to the light-emitting elements 13 arranged in the display region 11a and an inorganic protective film 25 may be arranged in a recess of the second substrate 21 surrounded by the peripheral projection A. In the case where the second substrate 21 is formed of an organic material substrate, such as a plastic substrate, preferably, an inorganic protective film 27 is also arranged on the surface exposed to the outside. The inorganic protective films 25 and 27 are arranged in order to prevent the permeation of gases (water vapor and oxygen).

The height d1, including the thickness of the inorganic protective film 25, of the peripheral projection A is slightly smaller than the height (thickness) d2 of the first sealing layer 31. Thus, the peripheral projection A is apart from the first substrate 11 by a distance d3. The distance d3 is a distance such that a gap between the first substrate 11 and the peripheral projection A can be filled with an uncured material for the second sealing layer by capillary action.

Each of the first and second sealing layers 31 and 32 is composed of a sealing material, for example, a thermosetting resin or photocurable resin. In particular, it is important that the second sealing layer 32 is arranged between the first substrate 11 and the second substrate 21 with no clearance so as to surround the entire perimeter of the first sealing layer 31 and to completely occupy the gap having the distance d3 between the first substrate 11 and the peripheral projection A of the second substrate 21.

The second sealing layer 32 is formed by feeding the uncured material for the second sealing layer 32 into the gap having the distance d3 between the first substrate 11 and the peripheral projection A by capillary action and then curing the material without protruding from the gap between the first substrate 11 and the second substrate 21. Thus, the second sealing layer 32 is arranged only between the first substrate 11 and the second substrate 21 to minimize the exposure to the outside.

The display 1a having the structure described above is a film-sealed display including the light-emitting elements 13 in the first sealing layer 31 arranged between the first substrate 11 and the second substrate 21. In the display 1a, the distance d3 of the gap between the first substrate 11 and the peripheral projection A, surrounding the display region 11a, of the second substrate 21 over the entire perimeter is smaller than the distance between the first substrate 11 and the second substrate 21 in the display region 11a. Furthermore, the second sealing layer 32 is arranged in the narrow gap over the entire perimeter. Thus, a portion where the second sealing layer 32 is exposed to the outside is minimized, preventing the permeation of external gases (water vapor and oxygen) into the first sealing layer 31 through the second sealing layer 32.

Even in the case where the light-emitting elements 13 and other elements covered with the first sealing layer 31 are composed of an organic material, the structure makes it possible to prevent the deterioration of these elements due to water and oxygen and improve the reliability of the display 1a.

Method for Producing Display

A method for producing the display 1a according to the first embodiment will be described below with reference to the cross-sectional process views of FIGS. 2A to 2E.

Figure 2A:
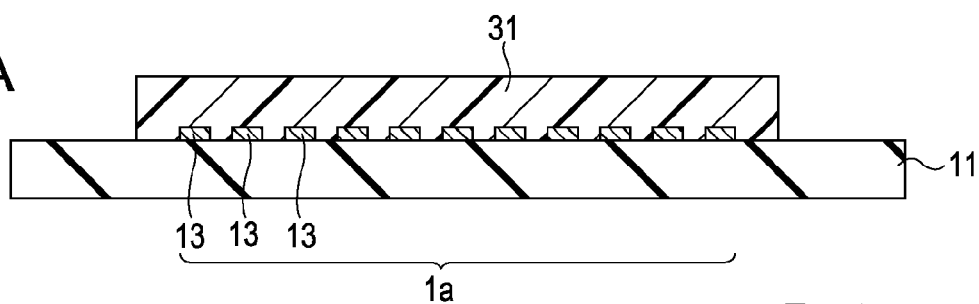
FIGS. 2A to 2E are cross-sectional process views illustrating a method for producing the display according to the first embodiment.

As shown in FIG. 2A, elements including the light-emitting elements 13 are formed on the display region 11a of the first substrate 11 optionally covered with an insulating film composed of an inorganic material. The light-emitting elements 13 are covered with an inorganic insulating film (not shown). Then the first sealing layer 31 is formed on the first substrate 11 so as to cover the display region 11a including the light-emitting elements 13 and expose the periphery of the display region 11a. The formation of the first sealing layer 31 is performed by, for example, printing or application. After the formation of the first sealing layer 31 on the first substrate 11, the first sealing layer 31 is cured by light irradiation or heat treatment, which is selected in response to a material constituting the first sealing layer 31.

Figure 2B:
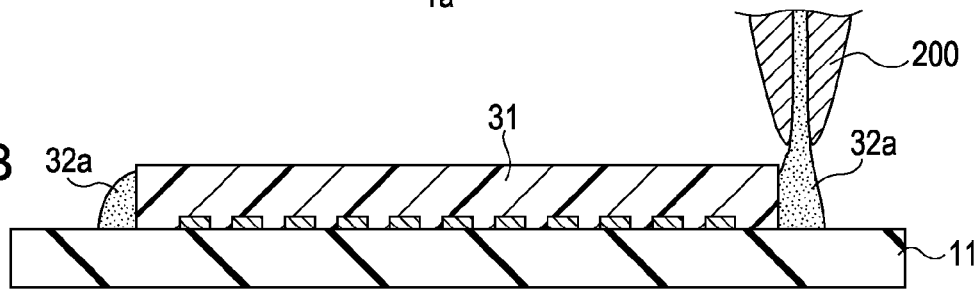

As shown in FIG. 2B, an uncured material 32a for the second sealing layer is fed onto the entire periphery of the first sealing layer 31 on the first substrate 11. In this case, the uncured material 32a, having an appropriate viscosity such that the uncured material does not excessively spread on the first substrate 11, for the second sealing layer is fed with, for example, a dispenser 200 onto the entire perimeter of the first sealing layer 31.

Figure 2C:
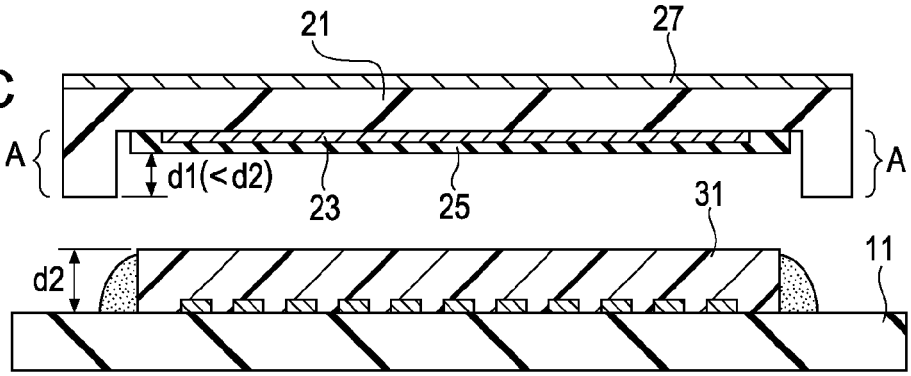

As shown in FIG. 2C, the second substrate 21 is prepared, the second substrate 21 having a cap structure in which the peripheral projection A is integrally formed. The second substrate 21 has substantially the same planar shape as the first substrate 11 and includes the color filter layer 23 and the inorganic protective film 25 configured to cover the color filter layer 23 in a portion surrounded by the peripheral projection A. The height d1 of the peripheral projection A in a state in which the inorganic protective film 25 is arranged to cover the color filter layer 23 is smaller than the height (thickness) d2 of the first sealing layer 31. A method for forming the cap structure is not limited. For example, a portion corresponding to the display region 11a may be deeply removed leaving the peripheral projection A. Furthermore, methods for forming the color filter layer 23 and the inorganic protective film 25 are not particularly limited.

The second substrate 21 described above is arranged so as to face a surface of the first substrate 11 on which the light-emitting elements 13 are arranged and to surround the first sealing layer 31 by the peripheral projection A.

Figure 2D:
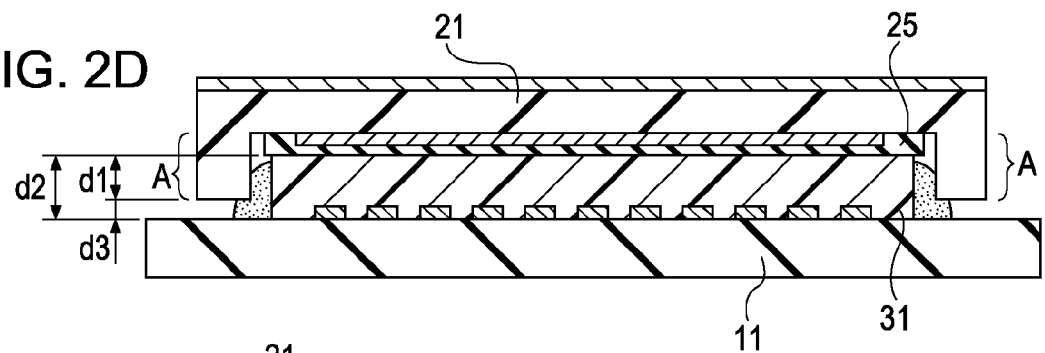

As shown in FIG. 2D, the first sealing layer 31 is held between the first substrate 11 and the recess of the second substrate 21 surrounded by the peripheral projection A to bring the inorganic protective film 25 on the second substrate 21 into close contact with the first sealing layer 31. This step is performed in a vacuum atmosphere. In this state, the height d1 of the peripheral projection A is smaller than the height (thickness) d2 of the first sealing layer 31, thus providing the gap having the distance d3 between the first substrate 11 and the peripheral projection A of the second substrate 21. The distance d3 is set in such a manner that the uncured material 32a for the second sealing layer is filled into the gap by capillary action.

Figure 2E:
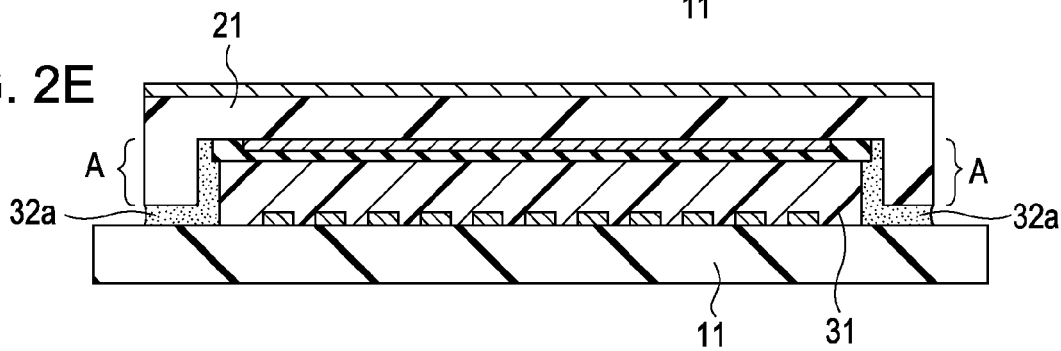

As shown in FIG. 2E, the ambient pressure of the first substrate 11 and the second substrate 21 that have been stacked is gradually increased to atmospheric pressure, so that the uncured material 32a for the second sealing layer fed to the periphery of the first sealing layer 31 is filled into the space between the first substrate 11 and the second substrate 21. Simultaneously, the uncured material 32a for the second sealing layer is filled by capillary action into the entirety of the gap having the distance d3 between the first substrate 11 and the peripheral projection A of the second substrate 21 without protruding from the gap having the distance d3 toward the outside.

Subsequently, as shown in FIG. 1, the uncured material 32a for the second sealing layer held between the first substrate 11 and the second substrate 21 is cured to form the second sealing layer 32. In this case, the curing of the material 32a for the second sealing layer is performed by light irradiation or heat treatment, which is appropriately selected in response to the material 32a for the second sealing layer.

In the production method according to the first embodiment, the material 32a for the second sealing layer fed to the periphery of the first sealing layer 31 is filled by capillary action into the gap having the distance d3 between the first substrate 11 and the peripheral projection A of the second substrate 21. It is thus possible to fill the material 32a for the second sealing layer to the first substrate 11, the second substrate 21, and the entire perimeter while the material does not protrude from the gap between the first substrate 11 and the second substrate 21, thereby providing the display 1a having the foregoing structure to minimize the area of the second sealing layer 32 exposed to the outside.

2. Second Embodiment
Structure of Display

Figure 3:
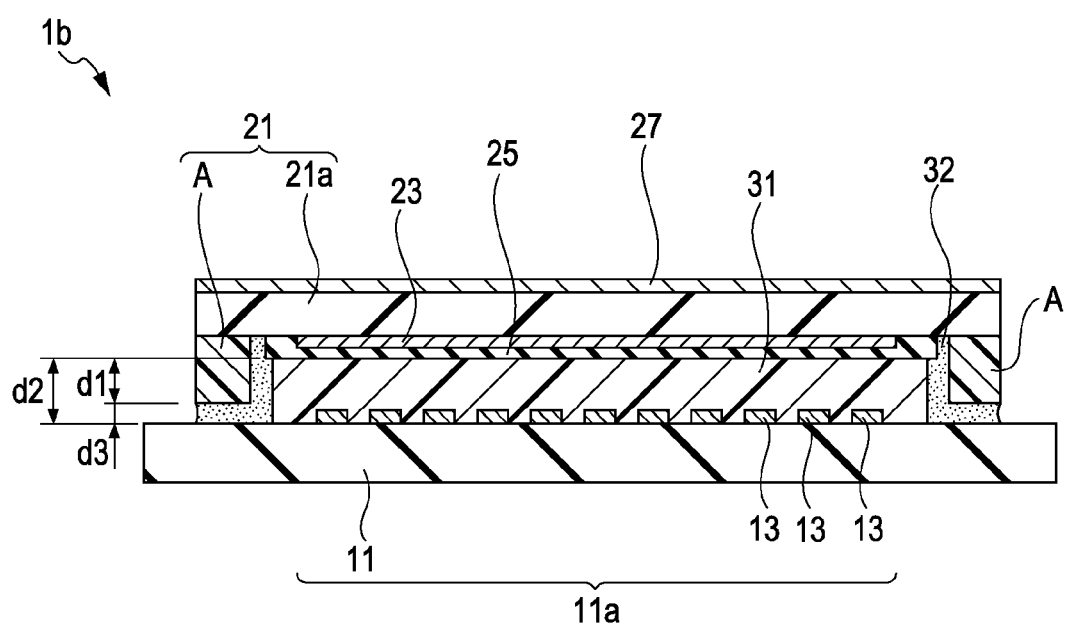
FIG. 3 is a schematic cross-sectional view illustrating a display according to a second embodiment.

FIG. 3 is a schematic cross-sectional view illustrating a display 1b according to a second embodiment. The display 1b shown in this figure has the same structure as the display 1a according to the first embodiment, except that the peripheral projection A arranged on the second substrate 21 is separately formed on a flat portion 21a of the second substrate 21.

In this case, the peripheral projection A is composed of, for example, an epoxy resin. The height of the peripheral projection A composed of the epoxy resin is the same as in the first embodiment. That is, the height d1, including the thickness of the inorganic protective film 25, of the peripheral projection A is slightly smaller than the height (thickness) d2 of the first sealing layer 31. Thus, the peripheral projection A is apart from the first substrate 11 by a distance d3. The distance d3 is a distance such that a gap between the first substrate 11 and the peripheral projection A can be filled with an uncured material for the second sealing layer by capillary action. Furthermore, the color filter layer 23 and the inorganic protective film 25 are arranged on the flat portion 21a surrounded by the separately formed peripheral projection A.

In particular, the second sealing layer 32 is arranged between the first substrate 11 and the second substrate 21 with no clearance so as to surround the entire perimeter of the first sealing layer 31 and to completely occupy the gap having the distance d3 between the first substrate 11 and the peripheral projection A of the second substrate 21. The second sealing layer 32 is formed by feeding the uncured material for the second sealing layer 32 into the gap having the distance d3 between the first substrate 11 and the peripheral projection A by capillary action and then curing the material without protruding from the gap between the first substrate 11 and the second substrate 21. Thus, the second sealing layer 32 is arranged only between the first substrate 11 and the second substrate 21 to minimize the exposure to the outside.

Also in the display 1b having the foregoing structure, the distance d3 of the gap between the first substrate 11 and the peripheral projection A, surrounding the display region 11a, of the second substrate 21 over the entire perimeter is smaller than the distance between the first substrate 11 and the second substrate 21 in the display region 11a. Furthermore, the second sealing layer 32 is arranged in the narrow gap over the entire perimeter. Thus, even in the case where the light-emitting elements 13 and other elements covered with the first sealing layer 31 are composed of an organic material as in the first embodiment, the structure makes it possible to prevent the deterioration of these elements due to water and oxygen and improve the reliability of the display 1b.

Furthermore, according to the second embodiment, it is possible to form the color filter layer 23 and the inorganic protective film 25 on the flat portion 21a of the second substrate 21 and then form the peripheral projection A. Thus, a simple process of forming the color filter layer 23 and the inorganic protective film 25 can be employed.

Method for Producing Display

A method for producing the display 1b according to the second embodiment is the same as the method according to the first embodiment shown in FIGS. 2A to 2E, except for a method for forming the second substrate 21, thereby providing the same effect as that of the production method according to the first embodiment.

That is, as described in the first embodiment with reference to FIGS. 2A and 2B, the light-emitting elements 13, the first sealing layer 31, and the second sealing layer 32 are formed on the first substrate 11. In the step described with reference to FIG. 2C, the second substrate 21 is prepared, the second substrate 21 having the separately formed peripheral projection A on the periphery of the flat portion 21a and including the color filter layer 23 and the inorganic protective film 25 on the flat portion 21a surrounded by the peripheral projection A. The second substrate 21 is produced by forming the color filter layer 23 and the inorganic protective film 25 on the flat portion 21a and then forming the peripheral projection A composed of, for example, an epoxy resin. The second substrate 21 described above is arranged so as to face a surface of the first substrate 11 on which the light-emitting elements 13 are arranged and to surround the first sealing layer 31 by the peripheral projection A.

Next, as described in the first embodiment with reference to FIG. 2D, the second substrate 21 is stacked on the first substrate 11 in a vacuum atmosphere. As described with reference to FIG. 2E, the ambient pressure is increased to atmospheric pressure, thereby performing the filling of the material 32a for the second sealing layer by capillary action. Then the material 32a for the second sealing layer is cured to form the second sealing layer 32. Thereby, the display 1b is completed.

As in the first embodiment, it is thus possible to fill the material 32a for the second sealing layer to the first substrate 11, the second substrate 21, and the entire perimeter while the material does not protrude form the gap between the first substrate 11 and the second substrate 21, thereby providing the display 1b having the foregoing structure to minimize the area of the second sealing layer 32 exposed to the outside.

According to the foregoing first and second embodiments of the present invention, the displays 1a and 1b including the organic electroluminescent elements have been described. The present invention, however, is not limited thereto. In particular, in the case of a device including elements composed of an organic material (e.g., organic thin-film transistors), it is possible to provide an effect to prevent the deterioration of the elements due to water and oxygen, which is advantageous. Furthermore, in the case of a device including elements composed of an organic material (e.g., organic thin-film transistors) other than displays, it is possible to provide an effect to prevent the deterioration of the elements.

3. Third Embodiment

FIGS. 4 to 8G show examples of electronic apparatuses including display panels formed of the displays according to an embodiment of the present invention described above. The display according to an embodiment of the present invention is applicable to display units of electronic apparatuses, in all fields, that display video signals fed thereinto or produced therein. Examples of the electronic apparatuses to which an embodiment of the present invention is applied will be described below.

Figure 4:
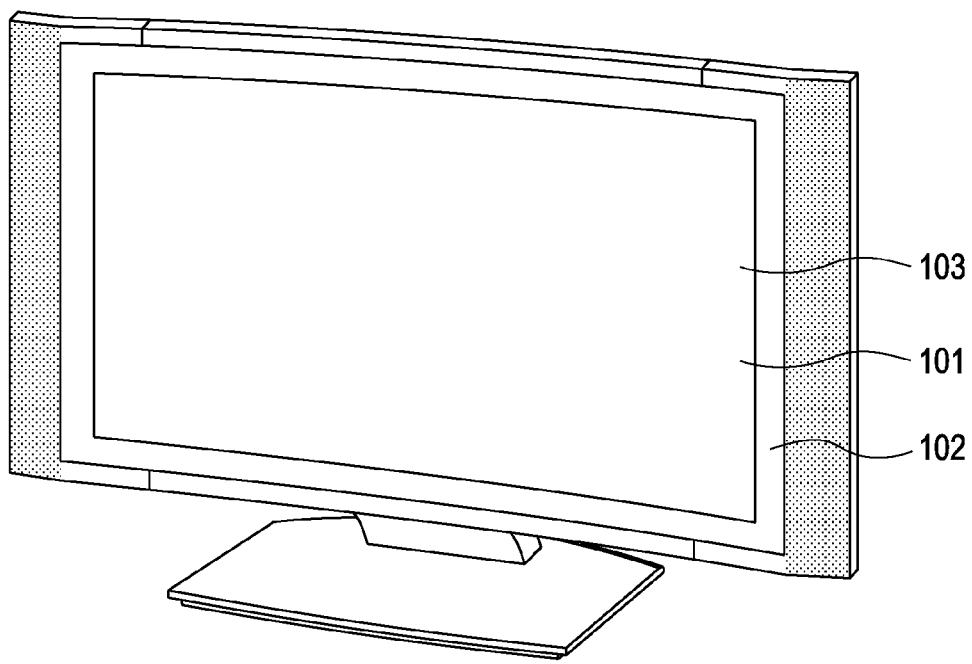
FIG. 4 is a perspective view illustrating a television set including a display according to an embodiment of the present invention.

FIG. 4 is a perspective view of a television set to which an embodiment of the present invention is applied. The television set according to this application example includes a display screen unit 101 having a front panel 102, and a filter glass 103. The display according to an embodiment of the present invention is used as the display screen unit 101.

Figure 5A:
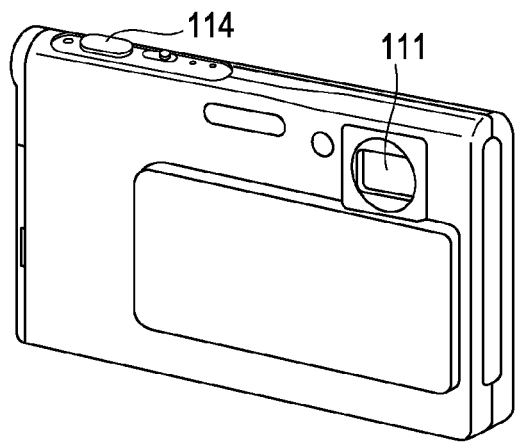
FIGS. 5A and 5B show a digital camera including a display according to an embodiment of the present invention.
Figure 5B:
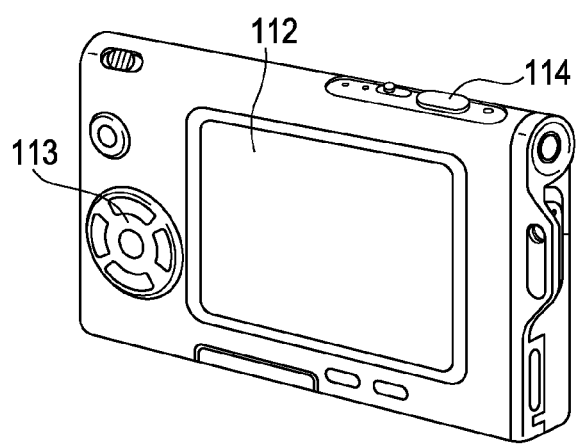

FIGS. 5A and 5B show a digital camera to which an embodiment of the present invention is applied. FIG. 5A is a perspective view of the digital camera when viewed from the front side thereof. FIG. 5B is a perspective view of the digital camera when viewed from the rear side thereof. The digital camera according to this application example includes a flash-light-emission unit 111, a display unit 112, a menu switch 113, and a shutter button 114. The display according to an embodiment of the present invention is used as the display unit 112.

Figure 6:
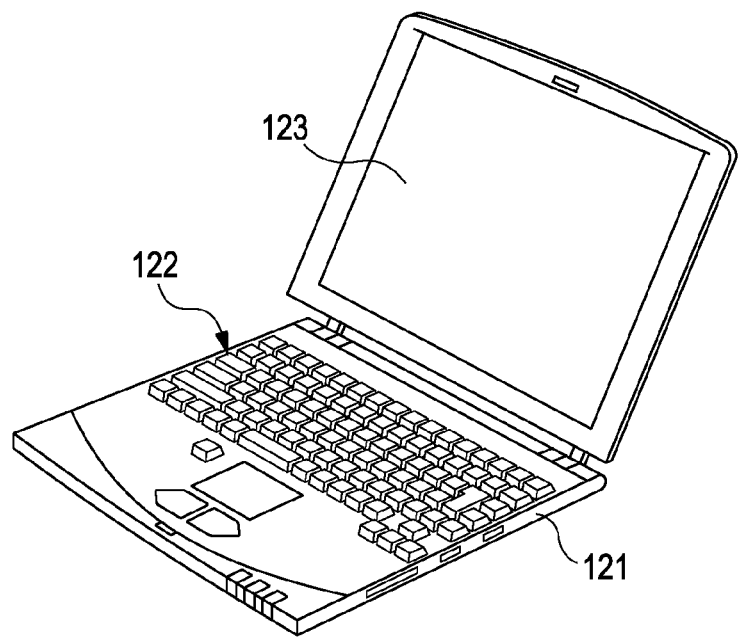
FIG. 6 is a perspective view illustrating a notebook personal computer including a display according to an embodiment of the present invention.

FIG. 6 is a perspective view of a notebook-sized personal computer to which an embodiment of the present invention applied. The notebook-sized personal computer according to this application example includes a body 121, a keyboard 122 used when inputting letters and so forth, and a display unit 123 that displays an image. The display according to an embodiment of the present invention is used as the display unit 123.

Figure 7:
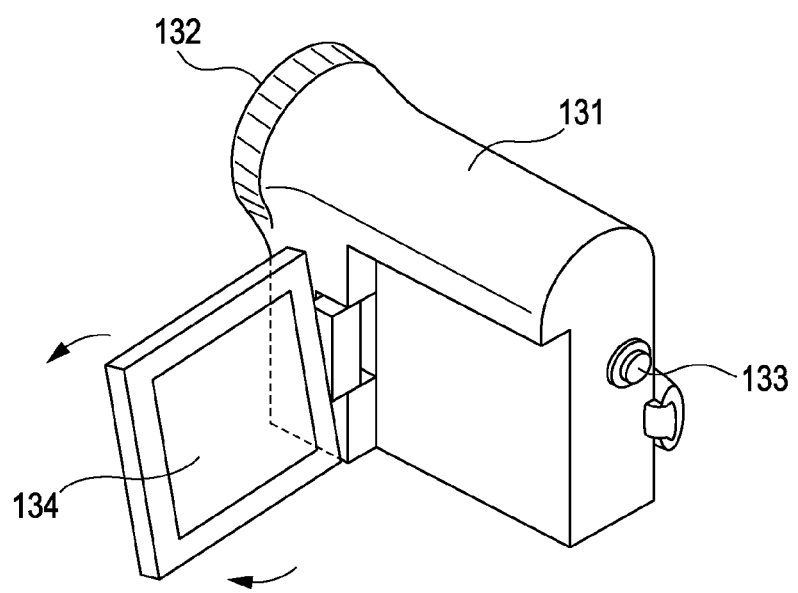
FIG. 7 is a perspective view illustrating a video camera including a display according to an embodiment of the present invention.

FIG. 7 is a perspective view of a video camera to which an embodiment of the present invention is applied. The video camera according to this application example includes a body 131, an objective lens 132 arranged on a side facing forward, a shooting start/stop switch 133, and a display unit 134. The display according to an embodiment of the present invention is used as the display unit 134.

FIGS. 8A to 8G show a portable terminal device, such as a cellular phone, to which an embodiment of the present invention is applied. FIG. 8A is a front view of the device in an open state. FIG. 8B is a side view thereof. FIG. 8C is a front view of the device in a closed state. FIG. 8D is a left-side view thereof. FIG. 8E is a right-side view thereof. FIG. 8F is a top view thereof. FIG. 8G is a bottom view thereof. The cellular phone according to this application example includes an upper casing 141, a lower casing 142, a connection (a hinge herein) 143, a display 144, a subdisplay 145, a picture light 146, and a camera 147. The displays according to an embodiment of the present invention are used for the display 144 and the subdisplay 145.

In the foregoing third embodiment, the electronic apparatuses including the display panels formed of the displays described in the first embodiment or the second embodiment have been described as exemplary electronic apparatuses according to an embodiment of the present invention. The electronic apparatus according to an embodiment of the present invention, however, may be an electronic apparatus including an element panel in which the light-emitting elements according to the first embodiment or the second embodiment are replaced with other elements composed of an organic material (e.g., organic thin-film transistors) to prevent the deterioration of the elements due to water and oxygen. It is also possible to improve the reliability of such an electronic apparatus.

The present application contains subject matter related to that disclosed in Japanese Priority Patent Application JP 2009-125944 filed in the Japan Patent Office on May 26, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display comprising:
   a first substrate including elements arranged on a main surface of the first substrate;
   a second substrate arranged so as to face the main surface of the first substrate on which the elements are arranged;
   a first sealing layer arranged on the first substrate and the elements and between the first substrate and the second substrate, the first sealing layer sealing the elements; and
   a second sealing layer arranged between the first substrate and the second substrate so as to abut and surround the first sealing layer,
   wherein,
   the second substrate has a peripheral projection, the entirety of which projects toward the main surface of the first substrate to form a first portion of a planar sidewall, the peripheral projection overlapping and surrounding the first sealing layer but spaced from the first sealing layer so as to have a first space therebetween,
   the peripheral projection is spaced from the first substrate so as to have a second space therebetween but with no portion of the first sealing layer therebetween,
   the second sealing layer is arranged between the first substrate and the second substrate so as to fill the first and second spaces, the second sealing layer being in contact with both the peripheral extension and the first substrate, and
   the second substrate is optically transparent and comprises plastic, glass or a foil with an insulating film.

2. The display according to claim 1, wherein the second sealing layer is arranged only between the first substrate and the second substrate.

3. The display according to claim 1, wherein:
   each of the first substrate and the second substrate is composed of an organic material, and
   a protective film is arranged on at least one surface of each of the first substrate and the second substrate.

4. The display according to claim 1, wherein the peripheral projection has a height smaller than a thickness of the first sealing layer.

5. The display according to claim 1, wherein the second substrate and the peripheral projection are a unitary structure.

6. The display according to claim 1, wherein the elements are organic electroluminescent elements.

7. A method for producing a display comprising:
   a first step of providing a first substrate with a first sealing layer thereon;
   a second step of feeding an uncured material for a second sealing layer onto the first substrate to so as to be in contact with the first substrate and adjacent to and to surround the first sealing layer;
   a third step of arranging a second substrate with a peripheral projection so as to face the first substrate such that the entirety of peripheral projection projects toward the first substrate and the first sealing layer is surrounded by the peripheral projection, and so that the first sealing layer is arranged between the first substrate and the second substrate and the peripheral projection is spaced apart from the first sealing layer and the first substrate;
   a fourth step of allowing the material for the second sealing layer that has been fed around the first sealing layer to entirely fill by capillary action a first space between the peripheral projection and the first substrate and a second space between first sealing layer and the peripheral projection, the first space having no portion of the first sealing layer therein and the second sealing layer being in contact with both the peripheral extension and the first substrate; and
   a fifth step of curing the material for the second sealing layer between the first substrate and the second substrate to form the second sealing layer,
   wherein, as a result of the foregoing steps,
   (a) the second sealing layer is arranged between the first substrate and the second substrate so as to fill the first and second spaces,
   (b) the first sealing layer and the second sealing layer are arranged adjacent to each other along the first substrate, and (c) the second substrate is optically transparent and comprises plastic, glass or a foil with an insulating film.

8. The method according to claim 7, wherein:
the third step is performed in a vacuum atmosphere; and
after the third step is performed, the fourth step is performed by increasing the pressure to atmospheric pressure.

9. An electronic apparatus comprising a panel, the panel including:
a first substrate provided with elements arranged on a main surface of the first substrate;
a second substrate arranged so as to face the main surface of the first substrate on which the elements are arranged;
a first sealing layer arranged on the first substrate and the elements and between the first substrate and the second substrate, the first sealing layer sealing the elements; and
a second sealing layer arranged between the first substrate and the second substrate so as to abut and surround the first sealing layer,
wherein,
the second substrate has a peripheral projection, the entirety of which projects toward the first substrate on which the elements are arranged to form a first portion of a planar sidewall, the peripheral projection overlapping and surrounding the first sealing layer but spaced apart from the first sealing layer so as to provide a first space therebetween,
the peripheral projection is spaced from the first substrate so as to have a second space therebetween but with no portion of the first sealing layer therebetween,
the second sealing layer is arranged between the first substrate and the second substrate so as to fill the first and second spaces, the second sealing layer being in contact with both the peripheral extension and the first substrate,
the first sealing layer and the second sealing layer are arranged adjacent to each other along the first substrate, and
the second substrate is optically transparent and comprises plastic, glass or a foil with an insulating film.

10. The electronic apparatus according to claim 9, wherein the panel is a display panel.

\* \* \* \* \*